United States Patent

Coker et al.

[11] Patent Number: 6,104,188
[45] Date of Patent: Aug. 15, 2000

[54] SURFACE ANALYSIS TEST DEFECT DETECTOR FOR DIRECT ACCESS STORAGE DEVICE

[75] Inventors: Jonathan Darrel Coker; Steven Michael Currie; Richard Leo Galbraith; Donald Earl Vosberg, all of Rochester, Minn.

[73] Assignee: International Business Machines Corporation, Armonk, N.Y.

[21] Appl. No.: 09/170,419

[22] Filed: Oct. 13, 1998

[51] Int. Cl.[7] .......................... G01R 33/12; G01N 27/82; G11B 27/36

[52] U.S. Cl. ................... 324/212; 360/25; 369/58

[58] Field of Search .................................. 324/210, 212; 360/25, 31; 369/58

[56] References Cited

U.S. PATENT DOCUMENTS

| | | | |
|---|---|---|---|
| 3,755,731 | 8/1973 | Young | 324/212 |
| 5,247,254 | 9/1993 | Huber et al. | 324/212 |
| 5,424,638 | 6/1995 | Huber | 324/212 |
| 5,592,080 | 1/1997 | Matsuno | 324/212 |

*Primary Examiner*—Gerard Strecker
*Attorney, Agent, or Firm*—Joan Pennington

[57] ABSTRACT

A method and apparatus are provided for detecting surface defects in a direct access storage device. Disk data readback sample values are converted to gain error values based upon an identified difference from predefined ideal data values. An error signal accumulator accumulates a summed value of error signals for a current sample and a predetermined number of past samples. Each sequential accumulator summed value is compared with a predetermined threshold value. An error output is generated responsive to each sequential accumulator summed value greater than or equal to the predetermined threshold value, the error output identifying the disk surface defect.

12 Claims, 3 Drawing Sheets

SURFACE ANALYSIS TEST DEFECT DETECTOR FOR DIRECT ACCESS STORAGE DEVICE

FIELD OF THE INVENTION

The present invention relates to methods and apparatus for detecting data, and more particularly to, a method and apparatus for detecting surface defects in a direct access storage device.

DESCRIPTION OF THE RELATED ART

Direct access storage devices (DASDs) often incorporating stacked, commonly rotated rigid magnetic disks are used for storage of data in magnetic form on the disk surfaces. Data is recorded in concentric, radially spaced data information tracks arrayed on the surfaces of the disks. Transducer heads driven in a path toward and away from the drive axis write data to the disks and read data from the disks. Typically servo information is provided on one or more disk surfaces for reading by the transducer heads for accurately and reliably positioning transducer heads on the disk surfaces to read and write data.

Techniques for detecting disk defects are known. Most commercially available disk drives store a standard primary defect list (P-list) and a grown defect list (G-list) in a protected area of the disk drive, often referred to as disk defect logs. The P-list is generated for each disk file at manufacturing time and stores information of specific locations of magnetic surface defect sites and the alternate site for storing data. The G-list is generated and periodically updated while the disk drive is in use including stored information of grown defects that occurred after manufacturing.

One of the many types of disk surface defects that may exist in a disk drive is believed to be caused by the deposit of foreign material, possibly a liquid deposit on the disk surface during the manufacturing process. These defective areas cause errors when attempting to read the data written to them, and thus need to be located and marked as unusable during the manufacturing process.

Currently, this is a major problem for disk drive manufacturers because a workable method for the detection of these errors does not exist.

SUMMARY OF THE INVENTION

A principal object of the present invention is to provide an improved method and apparatus for detecting surface defects in a direct access storage device. Other important objects of the present invention are to provide such method and apparatus substantially without negative effects; and to provide such method and apparatus that overcome some of the disadvantages of prior art arrangements.

In brief, a method and apparatus are provided for detecting surface defects in a direct access storage device. Disk data readback sample values are converted to gain error values based upon an identified difference from predefined ideal data values. An error signal accumulator accumulates a summed value of error signals for a current sample and a predetermined number of past samples. Each sequential accumulator summed value is compared with a predetermined threshold value. An error output is generated responsive to each sequential accumulator summed value greater than or equal to the predetermined threshold value, the error output identifying the disk surface defect.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
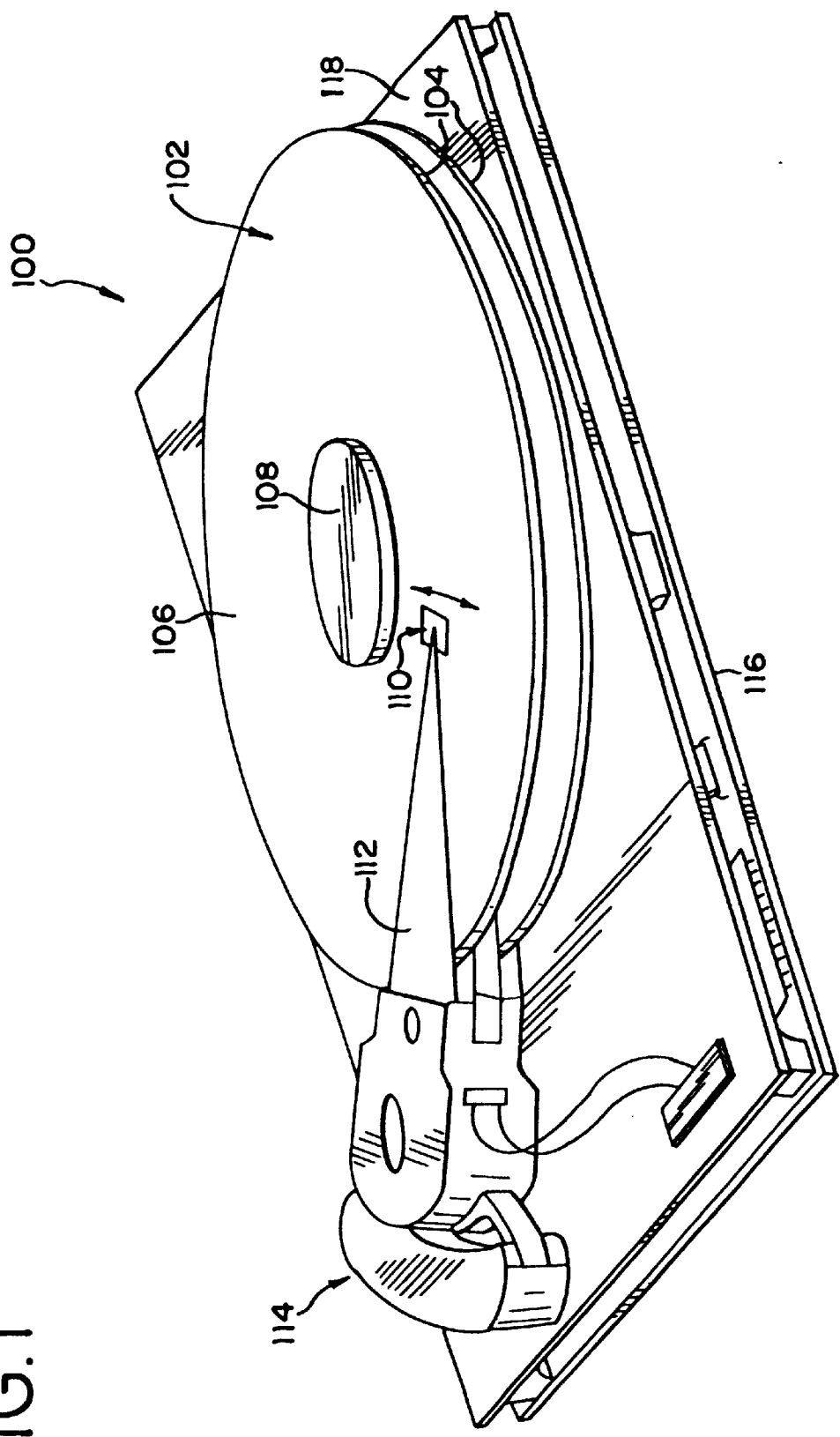
FIG. 1 is a diagrammatic view of a direct access storage device (DASD) embodying the present invention.

Having reference now to the drawings, in FIG. 1 there is illustrated a direct access data storage device (DASD) generally designated as 100 including a stack 102 of disks 104 each having at least one magnetic surface 106. The disks 104 are mounted parallel to one another for simultaneous rotation on and by an integrated spindle and motor assembly 108. Information on each magnetic disk surface 106 is read from or written to the disk surface 106 by a corresponding transducer head assembly 110 movable in a path having a radial component across the rotating disk surface 106.

Each transducer head assembly 110 is carried by an arm 112. The arms 112 are ganged together for simultaneous pivotal movement by a voice coil motor (VCM) magnet assembly 114. Drive signals applied to the VCM magnet assembly 114 cause the arms 112 to move in unison to position the transducer head assemblies 110 in registration with information storage tracks on the disk surfaces 106 where information is written or read. As shown in FIG. 1, an electronics card 116 is mounted together with a base support 118 of DASD 100. The utility of the present invention is not restricted to the details of a particular DASD construction.

Figure 2:
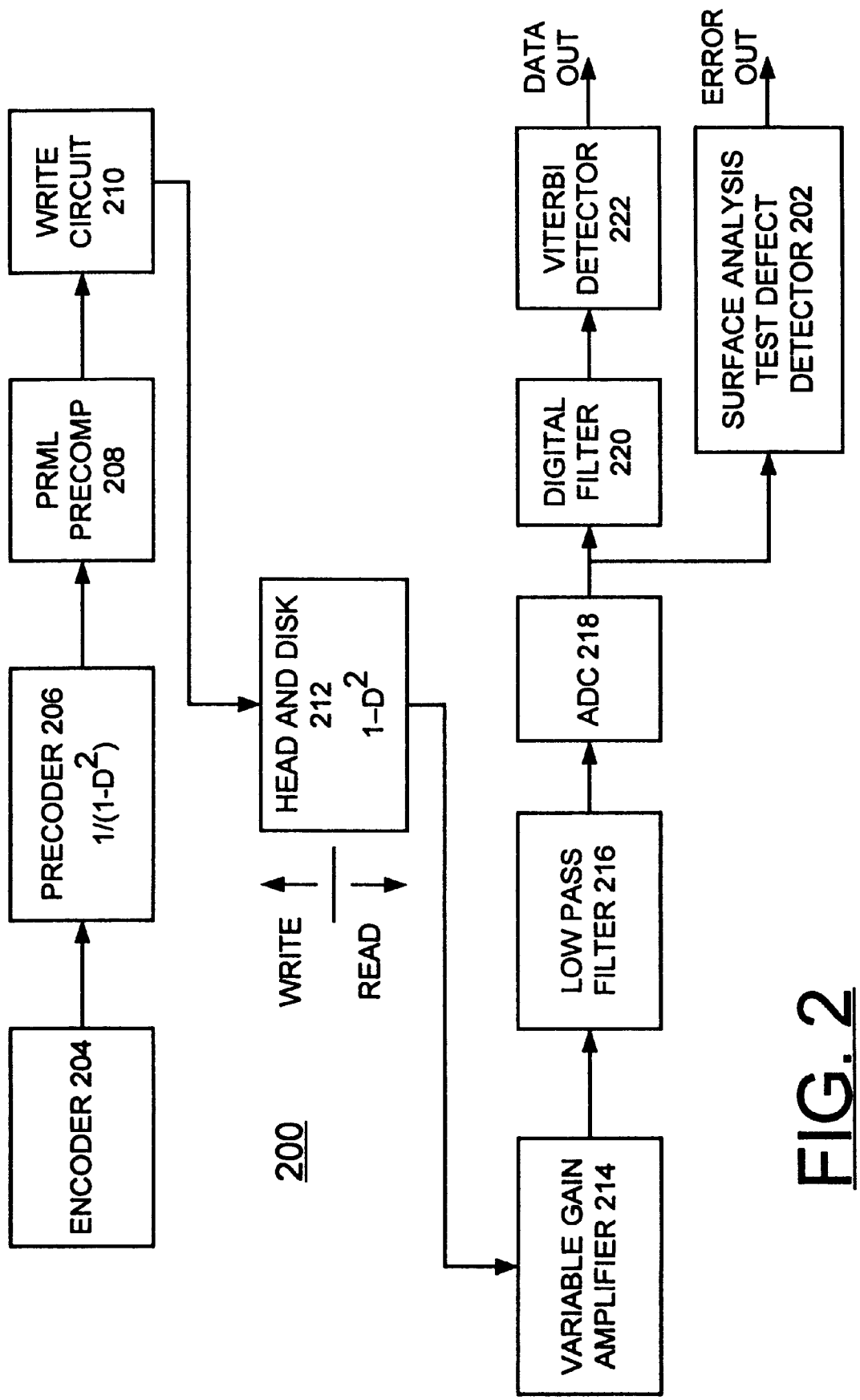
FIG. 2 is a block diagram of a data channel of the direct access storage device (DASD) of FIG. 1 embodying the present invention.

Referring now to FIG. 2, there is shown a block diagram of a partial-response maximum-likelihood (PRML) channel 200 available in the DASD 100 including a surface analysis test defect detector 202 of the invention. In accordance with features of the invention, the surface analysis test defect detector 202 identifies certain disk surface defects that would otherwise remain undetected with conventional surface analysis testing techniques. The disk surface defects are believed to be caused by the deposit of foreign material, possibly a liquid deposit on the disk surface during the manufacturing process. A predominant characteristic of this particular type of defect is a long readback sequence, for example, several hundred samples, with decreased readback signal amplitude.

Data to be written is applied to an encoder 204 for providing a modulation coded output having predefined run length constraints. A precoder 206 follows the encoder 204 described by a $1/(1 \oplus D^2)$ operation where D is a unit delay operator and the symbol $\oplus$ is used to represent modulo-2 addition. Modulo-2 addition can be thought of as an exclusive or operation. A PRML precomp 208 coupled to the precoder 206 provides a modulated binary pulse signal applied to a write circuit 210 that provides the modulated write current for writing to the disk surface. An analog read signal is obtained at head and disk block 212 described by the $(1-D^2)$ operation. When data is read back from the disk, the analog waveform is generated by the readback element moving over magnetic transition recorded on the disk surface 106. The read signal is applied to a variable gain amplifier (VGA) 214 and the amplified read signal is applied to a lowpass filter 216. The filtered read signal is converted to digital form by an analog-to-digital converter (ADC) 218 that provides, for example, 64 possible 6-bit sampled values. The discrete, six bit binary values represent either a +1, 0 or −1. The samples of the ADC 218 are applied to a digital filter 220, such as a ten tap finite impulse response (FIR) digital filter. The samples of the ADC 218 also are applied to the surface analysis test defect detector 202 of the invention. The filtered signal from the digital filter 220 is a class IV partial response (PR4) signal. The filtered PR4 signal from the digital filter 220 is applied to a Viterbi detector 222 to complete the maximum-likelihood (ML) detection process for data read back. It should be understood that the present invention is not limited to use with a partial-response maximum-likelihood (PRML) channel or a Viterbi detector. Features of the present invention can be used together with other data detection techniques.

Figure 3:
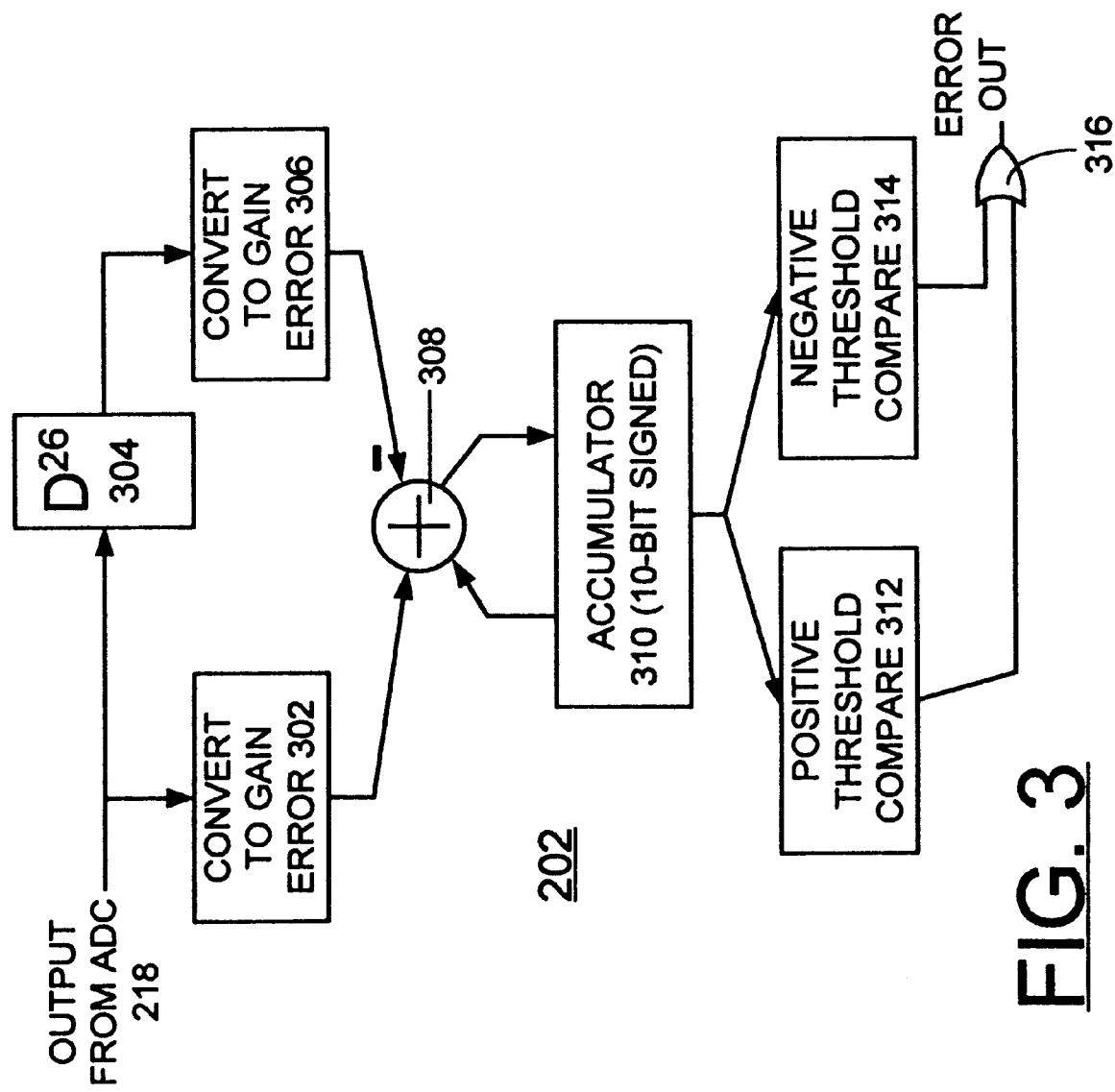
FIG. 3 is a schematic and block diagram representation of a surface analysis test defect detector of FIG. 2 in accordance with the present invention.

Referring now to FIG. 3, the surface analysis test defect detector 202 of the invention is illustrated. The discrete, six bit binary values representing the target values of +1, 0 or −1 from the ADC are passed to the surface analysis test defect detector 202 via two paths. In the first path, the binary values are presented immediately to a convert to gain error function 302. In the second path, the same binary values are presented in the same order via a delay function $D^{26}$ 304 to a convert to gain error function 306. The binary values applied to the convert to gain error function 306 are delayed by 26 sample times. The convert to gain error functions 302 and 306 produce a gain error for the applied binary values. The gain error is the difference between the actual six bit sample and the ideal six bit sample for the same trinary value of +1, 0 or −1. The surface analysis test defect detector 202 accumulates a signed sum of the sample gain errors.

The surface analysis test defect detector 202 includes an adder 308 coupled to an accumulator 310, such as a 10-bit signed accumulator. Adder 308 and accumulator 310 adds the signed gain error value from each current sample and subtracts the gain error from the delayed samples effectively producing a windowed accumulation. For any given sample, the accumulator 310 contains a windowed, signed sum of the gain errors for that sample and the most recent 26 samples. The delay function $D^{26}$ 304 and the 10-bit signed accumulator are initially set to zero at startup of the surface analysis test defect detector 202.

Each accumulated value contained in the 10-bit signed accumulator is compared to a programmable threshold. A positive threshold compare 312 and a negative threshold compare 314 coupled to the accumulator 310. The positive threshold compare 312 compares an applied positive accumulated value to a programmable 8-bit positive threshold between 0.0 (00000000) and 127.0 (11111110). The negative threshold compare 314 compares an applied negative accumulated value to a programmable 8-bit negative threshold between −0.5 (00000000) and −127.5 (11111110). An OR gate 316 is coupled to the positive threshold compare 312 and the negative threshold compare 314. If the signed sum, accumulated value of gain errors for the past 26 samples meets or exceeds the positive or negative programmed threshold, the surface analysis test defect detector 202 outputs an error via OR gate 316. The reported error at each sample is used to map the defect area of the disk surface 106.

Both the positive threshold compare 312 and the negative threshold compare 314 are independently controlled. Error reporting from either the positive threshold compare 312 or the negative threshold compare 314 can be blocked by setting the 8-bit register to a predefined value, such as FFH. The positive threshold compare 312 and the negative threshold compare 314 can be used simultaneously or individually.

It should be understood that features of the invention are not limited to the illustrated embodiment. For example, delay values other than the delay function $D^{26}$ 304 can be used. The other bit values can be used instead of the 6-bit sample values of ADC 218, 10-bit accumulator 310, and 8-bit positive and negative compares 312 and 314.

While the present invention has been described with reference to the details of the embodiments of the invention shown in the drawing, these details are not intended to limit the scope of the invention as claimed in the appended claims.

What is claimed is:

1. A method for detecting disk surface defects in a direct access storage device comprising the steps of:

sequentially converting disk readback sample values to error signal values;

sequentially accumulating a signed summed value of error signals for a current sample and a predetermined number of past samples;

comparing each sequential accumulator signed summed value with a predetermined threshold value; and generating an error output responsive to each said sequential accumulator summed value being greater than or equal to said predetermined threshold value, said error output identifying the disk surface defect.

2. The method for detecting disk surface defects as recited in claim 1 wherein the step of converting disk readback sample values to said error signal values includes the step of identifying a difference of said sample value from a predefined ideal data value.

3. The method for detecting disk surface defects as recited in claim 1 wherein the step of sequentially accumulating said signed summed value of error signals for said current sample and said predetermined number of past samples includes the steps of adding an error signal from said current sample and subtracting a summed error signal for said predetermined number of past samples.

4. The method for detecting disk surface defects as recited in claim 1 wherein the step of comparing each sequential accumulator signed summed value with said predetermined threshold value includes the steps of providing a positive threshold value and a negative threshold value, and comparing each sequential accumulator signed summed value with said positive threshold value or said negative threshold value.

5. The method for detecting disk surface defects as recited in claim 1 wherein the step of sequentially converting disk readback sample values to error signal values includes the step of applying said disk readback sample values to a delay function equal to said predetermined number of past samples, and converting said delayed disk readback sample values to error signal values.

6. A surface analysis test defect detector for detecting disk surface defects in a direct access storage device including an analog to digital converter for receiving a disk readback signal and for producing sample values; said surface analysis test defect detector comprising:

a first convert to gain error function receiving sample values from said analog to digital converter for producing an error signal for a current sample;

a second convert to gain error function receiving delayed sample values from said analog to digital converter for producing an error signal for a predetermined number of past samples;

an error signal accumulator for sequentially accumulating a signed summed value of said error signals for said current sample and said predetermined number of past samples;

at least one threshold comparator for comparing each sequential accumulator signed summed value with a predetermined threshold value and generating an error output responsive to each said sequential accumulator summed value greater than or equal to said predetermined threshold value, said error output identifying the disk surface defect.

7. The surface analysis test defect detector as recited in claim 6 wherein both said first convert to gain error function for producing said error signal for said current sample and said second convert to gain error function for producing said error signal for said predetermined number of past samples produce a gain error value, said gain error value corresponding to an identified difference from a predefined ideal data value.

8. The surface analysis test defect detector as recited in claim 6 wherein said at least one threshold comparator for comparing each sequential accumulator signed summed value includes a positive threshold comparator and a negative threshold comparator.

9. The surface analysis test defect detector as recited in claim 8 wherein said positive threshold comparator and said negative threshold comparator operate independently.

10. The surface analysis test defect detector as recited in claim 8 wherein each said positive threshold comparator and said negative threshold comparator contains a programmable threshold value.

11. A direct access storage device comprising:
a transducer for reading information from a disk surface to produce a readback signal;
an analog to digital converter for converting said analog readback signal to digital sample values;
a disk surface defect detector including:
a converter for converting said disk readback sample values to error values;
an error signal accumulator for sequentially accumulating a signed summed value of error signals for a current sample and a predetermined number of past samples;
at least one threshold comparator for comparing each sequential accumulator signed summed value with a predetermined threshold value and generating an error output responsive to each said sequential accumulator summed value greater than or equal to said predetermined threshold value, said error output identifying the disk surface defect.

12. A direct access storage device as recited in claim 11 wherein said predetermined number of past samples includes 26 past samples.

* * * * *